United States Patent
Chang et al.

(10) Patent No.: US 11,837,299 B2
(45) Date of Patent: Dec. 5, 2023

(54) OPERATION METHOD OF MULTI-BITS READ ONLY MEMORY

(71) Applicant: Chen-Feng Chang, Taoyuan (TW)

(72) Inventors: Chen-Feng Chang, Taoyuan (TW); Tien-Sheng Chao, Hsinchu (TW)

(73) Assignee: Jmem Technology Co., Ltd, Taipei (TW)

( * ) Notice: Subject to any disclaimer, the term of this patent is extended or adjusted under 35 U.S.C. 154(b) by 104 days.

(21) Appl. No.: 17/716,122

(22) Filed: Apr. 8, 2022

(65) Prior Publication Data

US 2022/0328115 A1 Oct. 13, 2022

Related U.S. Application Data

(60) Provisional application No. 63/201,104, filed on Apr. 13, 2021.

(51) Int. Cl.
*G11C 16/04* (2006.01)
*G11C 17/12* (2006.01)
*G11C 11/56* (2006.01)
*H10B 20/20* (2023.01)
*H10B 43/00* (2023.01)

(52) U.S. Cl.
CPC .......... *G11C 17/12* (2013.01); *G11C 11/5671* (2013.01); *G11C 16/0466* (2013.01); *H10B 20/20* (2023.02); *H10B 43/00* (2023.02)

(58) Field of Classification Search
CPC . G11C 17/12; G11C 11/5671; G11C 16/0466; G11C 11/5642; H10B 20/20; H10B 43/00; H01L 23/5252
USPC ...................................... 365/185.03, 185.24
See application file for complete search history.

(56) References Cited

U.S. PATENT DOCUMENTS

| 6,937,511 B2 | 8/2005 | Hsu et al. |
| 9,460,806 B2 | 10/2016 | Gautam et al. |
| 2005/0105337 A1 | 5/2005 | Cohen et al. |
| 2015/0348909 A1* | 12/2015 | Yamazaki ........... H01L 27/0688 438/638 |
| 2021/0175264 A1* | 6/2021 | Kawahito ......... H01L 27/14643 |
| 2023/0139833 A1* | 5/2023 | Yang ..................... G11C 17/18 257/529 |

FOREIGN PATENT DOCUMENTS

| EP | 1979912 B1 | 11/2012 | |
| TW | I282093 B | 6/2007 | |
| WO | WO-2018063138 A1 * | 4/2018 | ............. G06N 10/00 |

* cited by examiner

*Primary Examiner* — Michael T Tran

(57) ABSTRACT

An operation method of a multi-bits read only memory includes a step of applying a gate voltage to a conductive gate, a first voltage to a first electrode, and a second voltage to a second electrode. The multi-bits read only memory of the present invention includes a substrate and a transistor structure with the conductive gate mounted between the first electrode and the second electrode, a first oxide located between the first electrode and the conductive gate, and a second oxide located between the second electrode and the conductive gate. The present invention creates an initial state wherein the transistor structure is not conducting, an intermediate state wherein the first oxide is punched through by the first voltage, and a fully opened state wherein both the first oxide and the second oxide are punched through. The aforementioned states allow storage of multiple bits on the read only memory.

11 Claims, 5 Drawing Sheets

OPERATION METHOD OF MULTI-BITS READ ONLY MEMORY

CROSS-REFERENCE TO RELATED APPLICATION(S)

This application claims the priority benefit of provisional application Ser. No. 63/201,104 filed on Apr. 13, 2021, the entirety of which is hereby incorporated by reference herein and made a part of specification.

BACKGROUND OF THE INVENTION

1. Field of the Invention

The present invention relates to a read only memory, more particularly an operation method of a multi-bits read only memory. The present invention allows a transistor of the read only memory to be multi-bit programmable for a wide variety of industrial applications, such as increasing information confidentiality of precision components.

2. Description of the Related Art

As computers, communication products, and consumer electronics increase in popularity, electronics manufacturers become more aware and focus on protecting their independently developed products. For instance, in recent years, manufacturers often implement a One Time Programmable Read Only Memory (OTPROM) in a processor chip to protect data stored inside the chip from being altered. Further, both companies and academic institutes have put forth effort into researching designs for OTPROM. Currently, OTPROM is also widely used in sensor chips of smart phones for correcting and/or adjusting storing parameters of analog circuit signals. OTPROM is also used in smart phones to indicate a software version of an operating system.

The programming of OTPROM is well known to be an irreversible one-time data writing process. Generally, in an initial state, all the bits stored within OTPROM should have the same value. For example, each bit stored within each of the memory cells within each saving block of an OTPROM should be "0" in an initial state. Once a control chip writes data, or burns data, into the OTPROM, one bit or more than one bit stored within a designated memory cell of OTPROM will change from "0" to "1".

In comparison to rewritable memories, OTPROM has lower manufacturing cost and more stable information storing abilities. Each bit of the memory cell of OTPROM may be programmed by altering a state of a fuse corresponding to each of the bits. Once altered, OTPROM remains unchanged forever in electronics, hence the data-written OTPROM is perfect for storing default programs for electronics. For example, in an initial state of a typical OTPROM, all bits initially have value as "1". When data is burnt to the OTPROM, the fuse corresponding to some of the bits may break down from heat of the burn, leading to corresponding values to change from "1" to "0". Since this process is physically altering the OTPROM, the process is irreversible, and the information encoded remains even without electricity. For this reason, the said memory is called OTPROM. Each of the bits of OTPROM has value either as "0" or "1".

Currently, OTPROM is programmed by ways of either fusing or anti-fusing. Fusing refers to how data is burnt to OTPROM by burning and breaking down fuses corresponding to bits. Anti-fusing refers to how data is burnt to OTPROM by burning and melting fuses together to form electrical pathways or channels corresponding to bits. However, in both cases of fusing and anti-fusing, each of the bits being burnt can only be represented in a single bit as "0" or "1". This "single bit" constriction limits how logics may be programmed in all electronics applications, and is also incapable of protecting confidentiality of data information stored in the bits.

Due to the aforementioned problems, how data is programmed and stored in OTPROM should be improved. With years of experience in related fields, the inventor of the present invention felt the need to improve the said problems. With great academic research endeavors, the present invention provides a novel and effective design to improve upon the said problems.

SUMMARY OF THE INVENTION

The present invention enables a read only memory to demonstrate multi-bits functionality, and as a result, improving upon the said problem of having only single bit value of "0" or "1" on a single electronic component. The present invention is able to demonstrate multi-bits programmability on a Gate-All-Around Field-Effect Transistor (GAAFET), and thus demonstrates how the present invention improves data protection of electronics.

Furthermore, due to how the multi-bits read only memory is manufactured, the present invention allows the multi-bits read only memory to be minimized. For example, the multi-bits read only memory operated by the present invention has dimension less than 5 nanometers (nm). This allows the multi-bits read only memory to be used on advanced and confidential products for an improvement of information protection.

On the other hand, the present invention provides a novel way of operating read only memory. This novel way of operating read only memory transcends advanced electronics to even consumer electronics, and therefore the present invention is also applicable to be used in read only memories of general electronics.

Furthermore, the present invention provides how read only memory can be operated to provide multi-bits functionality to structures such as GAAFET and Silicon-Oxide-Nitride-Oxide-Silicon (SONOS) storing device. Apart from SONOS storing device, the present invention may also apply to memory components with nitride as a trapping layer for a transistor.

With regard to the said goals of the present invention, the present invention is able to provide multi-bits programmability on these transistor structures, and hence further providing practical aspects and improving upon patents and theses of prior arts.

The present invention provides an operation method of a multi-bits read only memory. The multi-bits read only memory includes a substrate and a transistor structure mounted on the substrate. The transistor structure includes a conductive gate and two ion-doped areas respectively located on two opposite sides of the conductive gate. The two ion-doped areas function as a first electrode and a second electrode located on opposite sides of the conductive gate in the transistor structure. A first gate oxide is formed between the first electrode and the conductive gate, and a second gate oxide is formed between the second electrode and the conductive gate.

The operation method of the multi-bits read only memory includes a step of providing a gate voltage to the conductive gate, a first voltage to the first electrode, and a second voltage to the second electrode while satisfying the following conditions:

condition (A): setting an initial state for the multi-bits read only memory by providing the gate voltage to the conductive gate, and grounding the first electrode and the second electrode;

condition (B): setting an intermediate state for the multi-bits read only memory by providing the gate voltage to the conductive gate, floating the second electrode, and increasing the first voltage of the first electrode until breaking down the first gate oxide; and condition (C): setting a fully opened state for the multi-bits read only memory by providing the gate voltage to the conductive gate, increasing the first voltage of the first electrode until breaking down the first gate oxide, and increasing the second voltage of the second electrode until breaking down both the first gate oxide and the second gate oxide;

wherein the initial state, the intermediate state, and the fully opened state are representable as multiple programmable multi-bits.

In an embodiment of the present invention, the first electrode is a drain of the transistor structure and the second electrode is a source of the transistor structure. In this case, the initial state is represented as (0, 0) as programmable multi-bits, the fully opened state is represented as (1, 1) as programmable multi-bits, and the intermediate state is represented as (0, 1) as programmable multi-bits.

In another embodiment of the present invention, the first electrode is the source of the transistor structure and the second electrode is the drain of the transistor structure. In this case, the initial state is represented as (0, 0) as programmable multi-bits, the fully opened state is represented as (1, 1) as programmable multi-bits, and the intermediate state is represented as (1, 0) as programmable multi-bits.

In yet another embodiment of the present invention, N nanowire channels are electrically connecting between the first electrode and the second electrode, and N is a positive integer greater than one. An insulating oxide layer is located between the substrate and the transistor structure.

Furthermore, while satisfying condition (B), the first voltage is increased by providing a sweeping voltage to the first electrode, providing a fixed voltage to the first electrode, or providing a pulse voltage to the first electrode.

Similarly, while satisfying condition (C), the second voltage is increased by providing a sweeping voltage to the second electrode, providing a fixed voltage to the second electrode, or providing a pulse voltage to the second electrode.

The operation method disclosed by the present invention is applicable to a transistor structure such as GAAFET, yet is also free to be elsewise. The multi-bits read only memory is also free to be elsewise than the SONOS storing device. Namely, the multi-bits read only memory is free to be any memory components with nitride as a trapping layer for a transistor.

In conclusion, the present invention discloses an operation method. The operation method provides a sweeping voltage, a fixed voltage, or a pulse voltage to the source and/or the drain of the transistor structure for breaking down corresponding gate oxides. This way the transistor structure becomes programmable for multi-bits instead of just a single bit. As a result, the present invention is able to protect confidential data stored within the multi-bits read only memory better in comparison to prior arts.

DETAILED DESCRIPTION OF THE INVENTION

Figure 1:
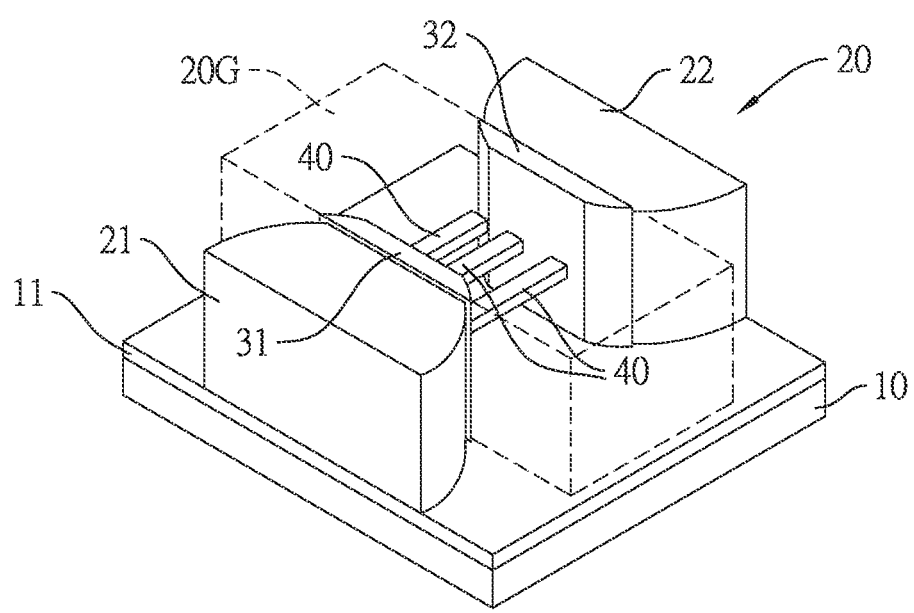
FIG. 1 is a perspective view of a multi-bits read only memory in an embodiment of the present invention.

With reference to FIG. 1, the present invention provides an operation method of a multi-bits read only memory. In an embodiment of the present invention, a multi-bits read only memory of the present invention includes a substrate 10. A transistor structure 20 is mounted on the substrate 10, and more particularly, an insulating oxide layer 11 is additionally mounted between the substrate 10 and the transistor structure 20.

In this embodiment, the transistor structure 20 is a Gate-All-Around FET (GAAFET). The transistor structure 20 includes a conductive gate 20G and two ion-doped areas respectively located on two opposite sides of the conductive gate 20G. The two ion-doped areas function as a first electrode 21 and a second electrode 22 located on opposite sides of the conductive gate 20G in the transistor structure 20. A first gate oxide 31 is formed between the first electrode 21 and the conductive gate 20G, and a second gate oxide 32 is formed between the second electrode 22 and the conductive gate 20G. Furthermore, N nanowire channels 40 are mounted between the first electrode 21 and the second electrode 22 to electrically connect the first electrode 21 and the second electrode 22. The number N is a positive integer greater than one. In other words, at least two nanowire channels 40 are electrically connecting the first electrode 21 and the second electrode 22.

Figure 2:
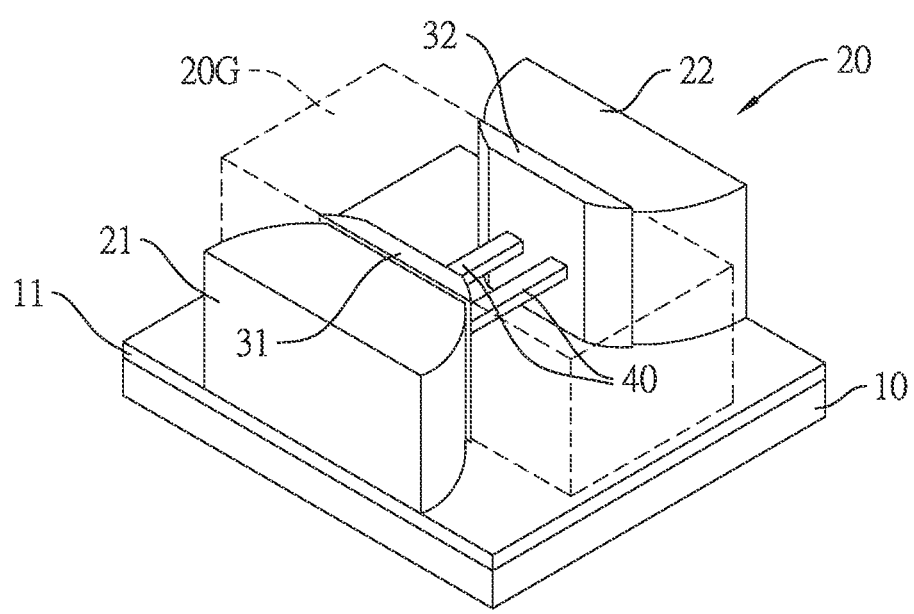
FIG. 2 is a perspective view of the multi-bits read only memory with two nanowire channels in the embodiment of the present invention.

With reference to FIG. 2, in this embodiment N=2, which means the transistor structure 20 has two nanowire channels 40 to store more than one bit of information between the first electrode 21 and the second electrode 22.

Figure 3:
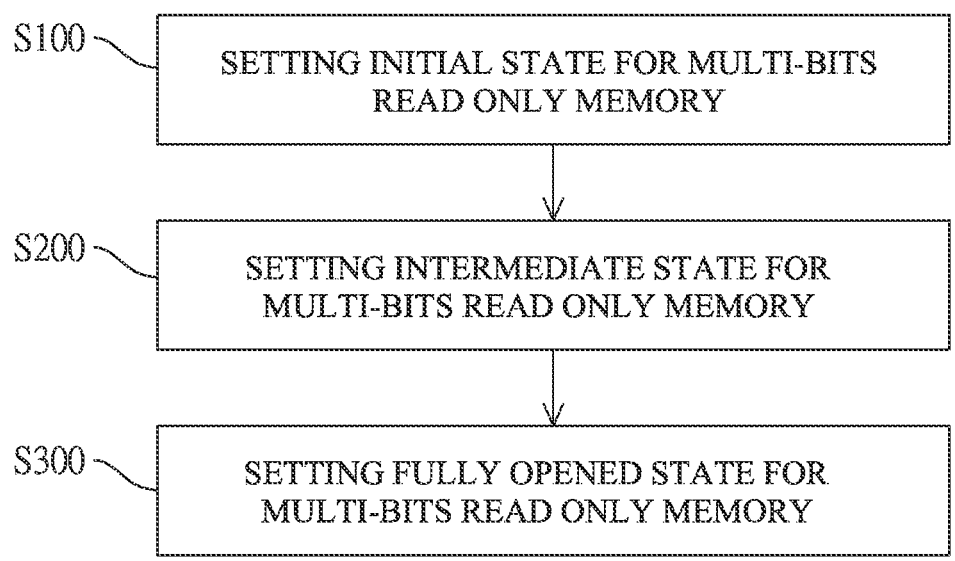
FIG. 3 is a flow chart of an operation method of the multi-bits read only memory in the embodiment of the present invention.

With further reference to FIG. 3, a flow chart discloses steps of the operation method of the multi-bits read only memory in the present embodiment. The operation method of the multi-bits read only memory includes a step of providing a gate voltage to the conductive gate 20G, a first voltage to the first electrode 21, and a second voltage to the second electrode 22 while satisfying conditions (A), (B), and (C). More particularly, the present invention includes the following sub-steps to satisfy conditions (A), (B), and (C):

step S100: satisfying condition (A) by setting an initial state for the multi-bits read only memory; wherein the multi-bits read only memory is set to the initial state by providing the gate voltage to the conductive gate 20G, and grounding the first electrode 21 and the second electrode 22;

step S200: satisfying condition (B) by setting an intermediate state for the multi-bits read only memory; wherein the multi-bits read only memory is set to the intermediate state by providing the gate voltage to the conductive gate, floating the second electrode 22, and increasing the first voltage of the first electrode 21 until breaking down the first gate oxide 31; and step S300: satisfying condition (C) by setting a fully opened state for the multi-bits read only memory; wherein the multi-bits read only memory is set to the fully opened state by providing the gate voltage to the conductive gate, increasing the first voltage of the first electrode until breaking down the first gate oxide, and increasing the second voltage of the second electrode 22 until breaking down both the first gate oxide 31 and the second gate oxide 32;

wherein the initial state, the intermediate state, and the fully opened state are representable as multiple programmable multi-bits.

Regarding the steps disclosed in FIG. 3, the operation method of the present invention mainly focuses on controlling the gate voltage (or $V_G$), the first voltage (or $V_{21}$), and the second voltage (or $V_{22}$).

When $V_{21}$ or $V_{22}$ exceeds a voltage threshold known as a breakdown voltage, the first gate oxide 31 or the second gate oxide 32 respectively will break down. Here breakdown refers to a punch-through effect. When the first gate oxide 31 is broken down by the punched-through effect, the first electrode 21 is short-circuited by the conductive gate 20G. Similarly, when the second gate oxide 32 is broken down by the punched-through effect, the second electrode 22 is also short-circuited by the conductive gate 20G.

The said punch-through effect is able to alter the transistor structure 20 and provides anti-fusing operations of programming bits. Generally speaking, anti-fusing operations include applying high voltages to a transistor to punch-through gate oxides, and forming gate-source and/or gate-drain connections in the transistor. This newly formed connection has lower electrical resistance as an oxide with high electrical resistance is punched through, and the newly formed electrical channel has significantly lower electrical resistance as silicon material.

In this embodiment, in the initial state, all bits of the multi-bits read only memory of the present invention have value "0". The aforementioned punch-through effect leads to formation of new electrical channels, and this newly formed connection corresponds to a bit value in the multi-bits read only memory changing from "0" to "1". Furthermore, in steps S200 and S300 while satisfying conditions (B) and (C), the voltages used in the present invention to break down oxides, namely $V_{21}$ and $V_{22}$, may respectively be a sweeping voltage, a fixed voltage, or a pulse voltage. However, $V_{21}$ and $V_{22}$ also may be elsewise in different voltage forms.

In step S100, when the conductive gate 20G receives $V_G$ and the first electrode 21 and the second electrode 22 are grounded, the transistor structure 20 is set to the initial state. In the said initial state, two sides of the transistor structure 20, in other words the first electrode 21 and the second electrode 22, and the conductive gate 20G are all electrically disconnected. For this reason, the initial state of the transistor structure 20 of the multi-bits read only memory is programmed by the operation method as (0, 0).

In step S200, when the conductive gate 20G receives $V_G$, the second electrode 22 is electrically floating, and $V_{21}$ of the first electrode 21 increases until the first gate oxide 31 is breaking down, the transistor structure 20 is set to the intermediate state.

In an embodiment of the present invention, the conductive gate 20G is a gate of the transistor structure 20, the first electrode 21 is a drain of the transistor structure 20 and the second electrode 22 is a source of the transistor structure 20. In this case, the first gate oxide 31 between the drain and the conductive gate 20G is punched through, forming the channel between the drain and the conductive gate 20G. As a result, the drain of the transistor structure 20, in other words the first electrode 21, and the conductive gate 20G are electrically connected, and the source of the transistor structure 20, in other words the second electrode 22, and the conductive gate 20G are still electrically disconnected. For this reason, the intermediate state of the transistor structure 20 of the multi-bits read only memory is programmed by the operation method as (0, 1).

In another embodiment of the present invention, the conductive gate 20G is the gate of the transistor structure 20, the first electrode 21 is the source of the transistor structure 20 and the second electrode 22 is the drain of the transistor structure 20. In this case, the first gate oxide 31 between the source and the conductive gate 20G is punched through, forming the channel between the source and the conductive gate 20G. As a result, the source of the transistor structure 20, in other words the first electrode 21, and the conductive gate 20G are electrically connected, and the drain of the transistor structure 20, in other words the second electrode 22, and the conductive gate 20G are still electrically disconnected. For this reason, the intermediate state of the transistor structure 20 of the multi-bits read only memory is programmed by the operation method as (1, 0).

In step S300, when the conductive gate 20G receives $V_G$, and $V_{21}$ of the first electrode 21 and $V_{22}$ of the second electrode 22 increase until both the first gate oxide 31 and the second gate oxide 32 are breaking down, the transistor structure 20 is set to be in the fully opened state. In the said fully opened state, both the first gate oxide 31 and the second gate oxide 32 are punched through, forming electrical connections between the first electrode 21, the conductive gate 20G, and the second electrode 22. In other words, electrical channels are fully opened for conduction between the drain, the conductive gate 20G, and the source of the transistor structure 20. For this reason, the fully opened state of the transistor structure 20 of the multi-bits read only memory is programmed by the operation method as (1, 1).

As a reminder, any technical personnel in fields relating to the present invention is free to make equivalent changes of the present invention after reading information disclosed by the present invention. However, any equivalent changes made relating to the present invention will be protected by what is claimed for the present invention. The operation to control $V_{21}$ and $V_{22}$ disclosed in the present invention is free to be elsewise, in other words, voltages applied to the first electrode 21 and the second electrode 22 may be elsewise than the sweeping voltage, a fixed voltage, or a pulse voltage. The important point is to break down or punch through the oxides so that the transistor structure 20 of the multi-bits read only memory is programmed by the operation method.

Figure 4:
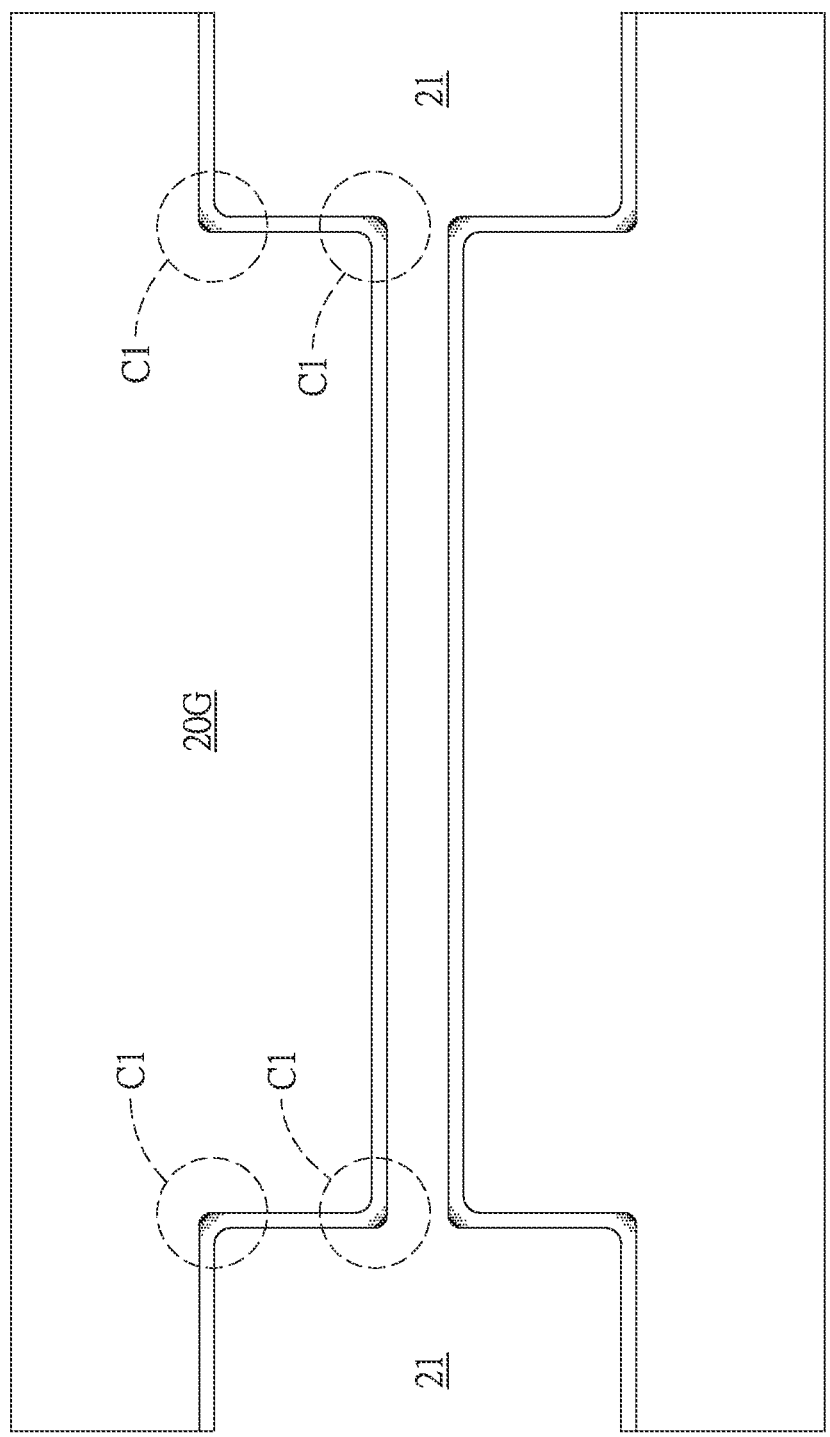
FIG. 4 is a perspective view of electric field distribution of the multi-bits read only memory in a fully opened state in the embodiment of the present invention.

With reference to FIG. 4, FIG. 4 depicts a perspective view of electric field distribution of the multi-bits read only memory in the fully opened state. When $V_{21}$ is provided and increased from the first electrode 21, at multiple corners C1 of the first gate oxide 31, electrical field crowding effect is observed. Similarly, when $V_{22}$ is provided and increased from the second electrode 22, at multiple corners C1 of the second gate oxide 32, electrical field crowding effect is also observed. In addition, at the corners C1 where the electrical field crowding effect takes place, electric field is measured to have a maximum value of $2.9*10^7$ volts per centimeter (V/cm). This concentration of power at the corners C1 is enough to break down and punch through oxides such as the first gate oxide 31 or the second gate oxide 32.

Figure 5:
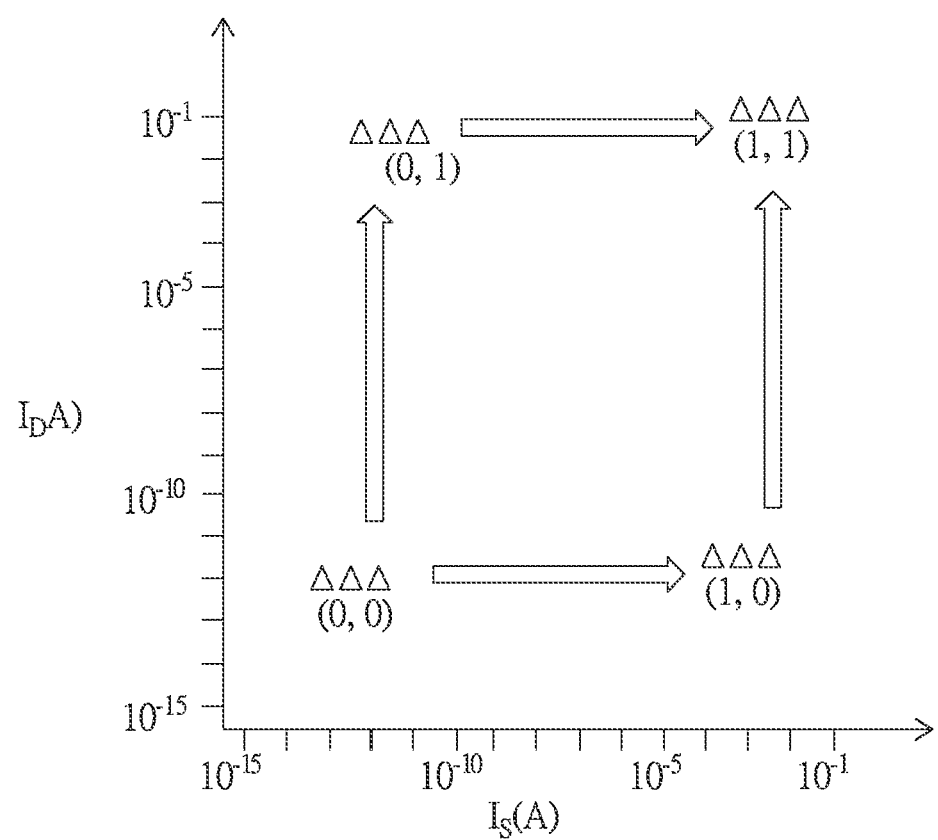
FIG. 5 is a perspective view of each breakdown results of the multi-bits read only memory with 1.5 volts of gate voltage in the embodiment of the present invention.

With reference to FIG. 5, FIG. 5 depicts a perspective view of each breakdown results of the multi-bits read only memory with $V_G=1.5$ V in the embodiment of the present invention. In FIG. 5, a horizontal axis represents a source current in ampere, represented as $I_S(A)$, and a vertical axis represents a drain current in ampere, represented as $I_D(A)$. Triangles in FIG. 5 represent experimental data samples.

As detailed in FIG. 5, in the initial state (0, 0) where no conduction happens between the gate, the source, and the drain of the transistor structure 20, $I_D$ equals around $10^{-2}$ A to $10^{-9}$ A, and $I_S$ equals around $10^{-13}$ A to $10^{-9}$ A.

In the intermediate state (0, 1) where conduction happens between the gate and the drain of the transistor structure 20, $I_D$ equals around $10^{-3}$ A to $10^{-2}$ A, and $I_S$ equals around $10^{-10}$ A to $10^{-7}$ A.

In the intermediate state (1, 0) where conduction happens between the gate and the source of the transistor structure 20, $I_D$ equals around $10^{-9}$ A to $10^{-6}$ A, and $I_S$ equals around $10^{-5}$ A to $10^{-3}$ A.

In the fully opened state (1, 1) where conduction happens between the gate, the source, and the drain of the transistor structure 20, $I_D$ equals around $10^{-4}$ A to $10^{-2}$ A, and $I_S$ equals around $10^{-6}$ A to $10^{-2}$ A.

As depicted by multiple arrows in FIG. 5, in different embodiments mentioned earlier, the present invention can either progress from the initial state (0, 0) to the intermediate state (0, 1) and then to the fully opened state (1, 1), or from the initial state (0, 0) to the intermediate state (1, 0) and then to the fully opened state (1, 1). In other words, the difference lies between a specification of the intermediate state, and the specification being whether an embodiment chooses to break down the first gate oxide 31 or the second gate oxide 32 first before breaking down both the first gate oxide 31 and the second gate oxide 32.

The experimental result depicted in FIG. 5 is disclosed as a reference for personnel in memory related fields to easily understand a current state of the memory component at hand. By understanding the current state and condition of the memory component, personnel should be able to easily formulate a next step for operating the memory component.

The present invention provides a novel way of operating read only memory. The present invention not only applies to GAAFET with more than one nanowire channels 40, but also any other memory components with nitride as a trapping layer for a transistor, namely a Silicon-Oxide-Nitride-Oxide-Silicon (SONOS) storing device. In an embodiment of the present invention, the multi-bits read only memory is the SONOS storing device. The SONOS storing device is a non-volatile memory (NVM) more closely relating to flash memory. The SONOS storing device however differs from main stream flash memories, as the SONOS storing device uses silicon nitride ($Si_3N_4$) as memory material instead of polycrystalline silicon. The operation method of the present invention applies to components with dimension of 5 nanometers (nm), and even applies to GAA and SONOS technologies under 5 nm. For this reason, the present invention demonstrates great application possibilities and great cutting-edge competitiveness.

In comparison with prior arts where current read only memories may only be programmed with a single bit of "0" or "1" using fusing or anti-fusing operations, the present invention presents a method to program multiple bits into a read only memory. By using the method disclosed in the present invention, the read only memory would be able to enhance data storing capabilities and to increase functionality. The data storing capabilities are enhanced by more densely storing multiple bits of information in the read only memory.

Even though numerous characteristics and advantages of the present invention have been set forth in the foregoing description, together with details of the structure and function of the invention, the disclosure is illustrative only. Any technical personnel in fields relating to the present invention is free to make equivalent changes of the present invention after reading information disclosed by the present invention. However, any equivalent changes made relating to the present invention will be protected by what is claimed for the present invention. Changes may be made in detail, especially in matters of shape, size, and arrangement of parts within the principles of the invention to the full extent indicated by the broad general meaning of the terms in which the appended claims are expressed.

In comparison with prior arts, the present invention is able to effectively overcome drawbacks of current techniques. The operation method of the multi-bits read only memory hereby may be applied to memories of consumer electronics, as well as memories of semiconductor industries, of integrated circuit industries, or within electronic components. As such, the present invention demonstrates great application possibilities and great cutting-edge competitiveness. The applicant of the present invention possesses trail proven experimental data to backup what is claimed for the present invention. Such experimental data also proves that technical details and outcomes of the present invention is drastically different from prior arts and also drastically different from what technical personnel of the related field would expect. The present invention should therefore be fully patentable.

What is claimed is:

1. An operation method of a multi-bits read only memory, wherein the multi-bits read only memory comprises a substrate and a transistor structure mounted on the substrate; the transistor structure comprises a conductive gate and two ion-doped areas respectively located on the two opposite sides of the conductive gate; the two ion-doped areas function as a first electrode and a second electrode located on opposite sides of the conductive gate in the transistor structure; a first gate oxide is formed between the first electrode and the conductive gate, and a second gate oxide is formed between the second electrode and the conductive gate; wherein the operation method comprises a step of providing a gate voltage to the conductive gate, a first voltage to the first electrode, and a second voltage to the second electrode while satisfying the following conditions:

condition (A): setting an initial state for the multi-bits read only memory by providing the gate voltage to the conductive gate, and grounding the first electrode and the second electrode;

condition (B): setting an intermediate state for the multi-bits read only memory by providing the gate voltage to the conductive gate, floating the second electrode, and increasing the first voltage of the first electrode until breaking down the first gate oxide; and condition (C): setting a fully opened state for the multi-bits read only memory by providing the gate voltage to the conductive gate, increasing the first voltage of the first electrode until breaking down the first gate oxide, and increasing the second voltage of the second electrode until breaking down both the first gate oxide and the second gate oxide;

wherein the initial state, the intermediate state, and the fully opened state are representable as multiple programmable multi-bits.

2. The operation method of the multi-bits read only memory as claimed in claim 1, wherein the first electrode is a drain of the transistor structure, and the second electrode is a source of the transistor structure.

3. The operation method of the multi-bits read only memory as claimed in claim 2, wherein the initial state is represented as (0, 0) as programmable multi-bits, the fully opened state is represented as (1, 1) as programmable multi-bits, and the intermediate state is represented as (0, 1) as programmable multi-bits.

4. The operation method of the multi-bits read only memory as claimed in claim 1, wherein the first electrode is a source of the transistor structure, and the second electrode is a drain of the transistor structure.

5. The operation method of the multi-bits read only memory as claimed in claim 4, wherein the initial state is represented as (0, 0) as programmable multi-bits, the fully opened state is represented as (1, 1) as programmable multi-bits, and the intermediate state is represented as (1, 0) as programmable multi-bits.

6. The operation method of the multi-bits read only memory as claimed in claim 1, wherein the transistor structure is a Gate-All-Around Field-Effect Transistor (GAAFET).

7. The operation method of the multi-bits read only memory as claimed in claim 1, wherein the multi-bits read only memory is a Silicon-Oxide-Nitride-Oxide-Silicon (SONOS) storing device.

8. The operation method of the multi-bits read only memory as claimed in claim 1, wherein N nanowire channels are mounted between and electrically connecting between the first electrode and the second electrode, and N is a positive integer greater than one.

9. The operation method of the multi-bits read only memory as claimed in claim 1, wherein an insulating oxide layer is mounted between the substrate and the transistor structure.

10. The operation method of the multi-bits read only memory as claimed in claim 1, wherein while satisfying condition (B), the first voltage is increased by providing a sweeping voltage to the first electrode, providing a fixed voltage to the first electrode, or providing a pulse voltage to the first electrode.

11. The operation method of the multi-bits read only memory as claimed in claim 1, wherein while satisfying condition (C), the second voltage is increased by providing a sweeping voltage to the second electrode, providing a fixed voltage to the second electrode, or providing a pulse voltage to the second electrode.

* * * * *